United States Patent
Ahn et al.

(10) Patent No.: US 6,534,420 B2
(45) Date of Patent: Mar. 18, 2003

(54) METHODS FOR FORMING DIELECTRIC MATERIALS AND METHODS FOR FORMING SEMICONDUCTOR DEVICES

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/908,767

(22) Filed: Jul. 18, 2001

(65) Prior Publication Data

US 2003/0017717 A1 Jan. 23, 2003

(51) Int. Cl.[7] ................... H01L 21/31; H01L 21/469
(52) U.S. Cl. ................... 438/768; 438/240; 438/287; 438/785
(58) Field of Search ................... 438/216, 240, 438/287, 492, 507, 765, 768, 778, 785

(56) References Cited

U.S. PATENT DOCUMENTS

| | | | | |
|---|---|---|---|---|
| 5,494,840 A | * | 2/1996 | Ohmi | 438/240 |
| 5,999,379 A | * | 12/1999 | Hsiao et al. | 360/320 |
| 6,261,917 B1 | * | 7/2001 | Quek et al. | 438/317 |
| 6,303,427 B1 | * | 10/2001 | Song et al. | 438/197 |
| 6,391,727 B1 | * | 5/2002 | Park | 438/240 |
| 6,391,801 B1 | * | 5/2002 | Yang | 427/126.3 |

OTHER PUBLICATIONS

Wolf et al, "Silicon Processing for the VLSI Era: vol. 1—Process Technology", 1986, Lattice Press, vol. 1, pp. 335, 374–378.*

Xin Guo Et Al., "High Quality Ultra–thin (1.5 nm) $TiO_2$/ $Si_3N_4$ Gate Dielectric for Deep Sub–micron CMOS technology," 4 pages, ( 1999).

H.F. Luan Et Al., "High quality $Ta_2O_5$ gate dielectrice with $T_{ox.eq}$ <10 A," 4 pages, (1999).

B.H. Lee Et Al., "Ultrathin Hafnium Oxide with Low Leakage and Excellent Reliability for Alternative Gate Dielectric Application," 4 pages, ( 1999).

Y. Saito Et Al, "High–Integrity Silicon Oxide Grown at Low–Temperature by Atomic Oxygen Generated in High–Density Krypton Plasma," 2 pages, ( 1999).

TiO2 Gate Insulator of a 1–nm Equilivant Oxide Thickness Deposites by Electron–Beam Evaparoation, K. Haraguchi et al., 2 pages.

Ion–beam–assisted deposition of thin fils, Applied Optics/ vol. 22, No. 1/Jan. 1, 1983, pp. 178–184.

Low–temperature large–grain poly–Si direct deposition by microwave plasma enhanced chemical vapor depostion using $Sih_4$/Xe, J. Vac. Sci. Technol. A 17)5), Sep./Oct. 1999, pp. 3134–3138.

* cited by examiner

Primary Examiner—Amir Zarabian
Assistant Examiner—Jamie L. Brophy
(74) Attorney, Agent, or Firm—Wells St. John P.S.

(57) ABSTRACT

Embodiments in accordance with the present invention provide methods of forming such dielectric materials, dielectric material layers and various semiconductor devices that employ such materials and layers. In general, embodiments of the present invention provide for physically vapor forming a high purity metal layer over the semiconductor substrate and after forming such a layer oxidizing the high purity metal layer to form the dielectric material employing atomic oxygen generated in a high density plasma environment. Such a dielectric material is useful in the forming of a variety of semiconductor devices such as transistors, capacitors and the like.

36 Claims, 3 Drawing Sheets

METHODS FOR FORMING DIELECTRIC MATERIALS AND METHODS FOR FORMING SEMICONDUCTOR DEVICES

TECHNICAL FIELD

The present invention relates generally to methods of forming dielectric materials and devices fabricated therewith. More specifically, the present invention relates to methods of forming high purity dielectric materials over a semiconductor substrate and devices formed therewith.

BACKGROUND

As the performance of integrated circuits (ICs) increases, both with regard to more complex functionality and higher speeds, there is a need for improved dielectric materials. Such performance increases are often obtained by scaling, that is decreasing the area or size of individual device components that are used to form such integrated circuits. One example of such scaling is the reduction of the gate length of a typical transistor which, over the past several years, has gone from several microns to fractions of a micron. Such scaling efforts have also resulted in a reduction in the physical size of capacitors used in a variety of ICs such as DRAMS and SRAMS (dynamic and static random access memories, respectively).

While such scaling efforts have generally resulted in the desired increases in performance and complex functionality, such reductions in area or size also impact at least some characteristics of the devices so "scaled." For example, reducing the gate length of a transistor generally reduces the transistor's output and decreasing the size of a capacitor generally reduces the capacitance or amount of charge such a capacitor can store. Fortunately, changing other features of such devices has made it possible to at least control these changes. Thus as the gate length of the typical transistor has been reduced, the gate dielectric layer's thickness has also been reduced to at least partially compensate for what might otherwise be a change in device output. Similarly, as the size of capacitor structures has been reduced, materials such as hemispherically grained polysilicon (HSG) have been employed to increase the effective surface area of such structures and compensate, at least in part, for such size reductions. However, it appears likely that as scaling continues, such exemplary compensation techniques may not continue to provide acceptable results.

For example silicon dioxide ($SiO_2$), with a dielectric constant of about 3.9, remains the most common material employed for gate dielectric layers. To maintain transistor output at an acceptable level, a transistor having a gate length of 0.1 micron will require a $SiO_2$ layer which is ultra-thin that is with a thickness of about 2 nanometers (nm). The forming and use of such ultra-thin $SiO_2$ layers is problematic for a variety of reasons since such layers consist of only a few layers of molecules. Thus only one additional or missing layer of molecules can have a dramatic effect on device performance; for example where a desired layer is four $SiO_2$ molecules thick, a change of one molecule will change a characteristic such as the layer's capacitance by as much as 25%. In addition, such thin layers typically exhibit high current leakage, for example due to band to band or Fowler-Nordheim tunneling. Such layers are also more susceptible to dopant penetration or diffusion through the layer thus changing the characteristics of an adjacent layer or region; for example boron diffusion from the gate electrode into the channel region can alter channel characteristics.

Alternative dielectric materials to $SiO_2$ that allow the forming of a thicker layer with acceptable dielectric properties are by virtue of their higher dielectric constant of interest. For the purpose of illustration, a gate dielectric layer formed of an alternative material having an appropriately high dielectric constant can allow for a thickness of that alternate material layer several times that of a $SiO_2$ layer while having the performance characteristics of the thinner $SiO_2$ layer. Thus the thicker alternative material gate dielectric layer is said to have the equivalent oxide thickness (EOT) of the thinner $SiO_2$ layer.

Alternate dielectric materials such as the oxides of titanium, aluminum, tantalum and others have therefore received attention as replacements for $SiO_2$. However, such alternate materials generally need to exhibit, in addition to a dielectric constant greater than that of $SiO_2$, a large band-gap with a favorable band alignment, low interface state density, good thermal stability and the ability to be formed in a manner consistent with known semiconductor process methods at reasonable cost and yield. Unfortunately, many candidate alternative materials having an appropriately high dielectric constant, and meeting these additional requirements are difficult to form. Also, even where such alternate materials can be formed, the methods currently known are generally problematic as resulting material layers often include contaminant moieties that reduce the integrity of the material from that which is desired. Thus it would desirable provide methods for forming such alternate dielectric materials and as well as the various semiconductor devices that can be formed therewith. It would be additionally desirable if such methods provided for the forming of the dielectric materials that are essentially free of contaminating moieties, thus having high-integrity. Finally it would be desirable for such methods to provide the desired dielectric material in a manner consistent with common semiconductor process methods and with high yield.

SUMMARY

Embodiments in accordance with the present invention provide methods of forming dielectric materials that are alternatives to materials such as $SiO_2$, as well as semiconductor devices that employ such dielectric materials.

In an exemplary embodiment of the present invention, a semiconductor substrate is provided within a vacuum chamber. High purity metal is physically vapor formed over the semiconductor substrate to form a metal layer. After such forming, the metal layer is oxidized to form a dielectric material. The oxidation employs atomic oxygen generated in a high density plasma.

Some embodiments in accordance with the present invention provide for physically vapor forming the high purity metal layer by an evaporation process, for example an electron beam evaporation process that employs an electron beam evaporation apparatus. Such or other embodiments employ low energy ion-bombardment during the evaporation process. Where such ion-bombardment is provided, generally a low density beam of ions is directed towards the semiconductor substrate during the physical vapor forming of the metal layer.

Once a desired thickness of the high purity metal layer is formed, generally such metal layer is oxidized to form a dielectric or insulative material. Embodiments in accordance with the present invention generally provide for oxidizing the high purity metal layer by employing a source of atomic oxygen. Such or other embodiments generally form the atomic oxygen by providing a mixture of oxygen gas and a noble gas into a high density plasma formed by employing a microwave power source to provide microwave energy at an appropriate frequency and power level.

Some embodiments of the present invention encompass semiconductor devices such as transistors, capacitors and the like, that employ dielectric material layers formed in accordance with the present invention. Such and other embodiments in accordance with the present invention encompass integrated circuits such as dynamic and static random memories (DRAMs and SRAMs) that employ transistors, capacitors and the like formed in accordance with the present invention. Such integrated circuits are formed having dielectric material layers formed in accordance with the methods of the present invention. Some semiconductor device embodiments of the present invention encompass a dielectric material layer having an equivalent oxide thickness (EOT) of 2 nanometers or less.

BRIEF DESCRIPTION OF THE DRAWINGS

Embodiments in accordance with the present invention are described below with reference to the following accompanying drawings.

DETAILED DESCRIPTION

This disclosure of the invention is submitted in furtherance of the constitutional purposes of the U.S. Patent Laws "to promote the progress of science and useful arts" (Article 1, Section 8).

Embodiments in accordance with the present invention will be described with reference to the aforementioned figures. To aid in interpretation of the description of the illustrations and claims that follow, the term "semiconductor substrate" is defined to mean any construction encompassing silicon semiconductive material, including, but not limited to, bulk silicon semiconductive materials such as a silicon semiconductor wafer (either alone or in assemblies encompassing other materials thereon) and silicon semiconductive material layers (either alone or in assemblies encompassing other materials). The term "substrate" refers to any supporting structure, including, but not limited to, the semiconductor substrates described above. The term "high purity" is used herein and will be understood to refer to materials having a designated purity that is at least about 99.9% and the term "ultra-high purity" to refer to materials having a designated purity that is at least about 99.999% purity. In addition, the term "high density" is used to describe a particular type of plasma having a plasma density that is at least about $10^{12}$ per cubic centimeter.

Figure 1:
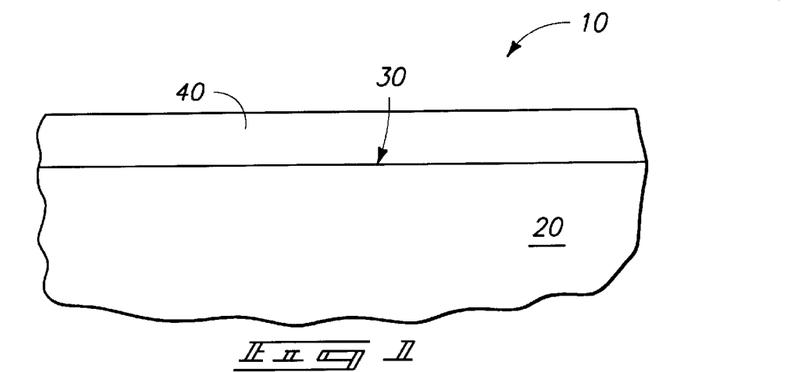
FIG. 1 is a cross-sectional view of a semiconductor wafer fragment at an early stage of processing, depicting a dielectric layer formed in accordance with an embodiment of the present.

Referring to FIG. 1, a semiconductor wafer fragment 10 is shown depicted during the processing of an embodiment in accordance with the present invention. Wafer fragment 10 encompasses a semiconductor substrate 20, a surface 30 of the substrate 20, and a dielectric material layer 40 overlying surface 30.

As described above, semiconductive substrate 20 is defined to mean any construction encompassing silicon semiconductive material. Generally a cross-sectional representation of such a semiconductive substrate 20, will include a variety of doped regions as are generally present for semiconductor device structures. Some of such doped regions, for example well regions, being present even at an early stage of processing. However, for ease of understanding the present invention, such doped regions that may be present are not shown in FIG. 1.

Surface 30 is an outermost boundary of substrate 20. For illustrative purposes, surface 30 can be an upper surface of a single crystal silicon substrate, an epitaxially grown silicon layer or any other appropriate material. Dielectric material layer 40 is generally formed of a metal selected from the group of metals consisting of titanium (Ti), yttrium (Y), zirconium (Zr), hafnium (Hf) and mixtures thereof, the selected metal being subsequently oxidized to form a dielectric material, typically a metal oxide. In addition, some embodiments in accordance with the present invention include dielectric material layers 40 that are formed from the oxidation of a deposited layer encompassing a metal-silicon alloy. One such exemplary metal-silicon alloy is zirconium silicide ($ZrSi_2$) which when oxidized, in accordance with embodiments of the present invention, forms zirconium silicate ($ZrSiO_4$).

It will be noted that embodiments of the present invention advantageously form dielectric material layers of high integrity. That is to say that such dielectric material layers are essentially free of the deleterious influence of the various contaminating moieties that are generally present within such dielectric material layers formed using previously known methods. For example, it is well known that metal oxides formed using chemical vapor deposition (CVD) processes typically employ organo-metal compounds as precursors. Generally such CVD processes provide such metal oxides with as much as several weight percent carbon as a contaminating moiety. In another previously known method, a desired metal oxide material is directly physically vapor deposited by sputtering. However, such a sputtering method generally results in a material layer that at least includes gases employed to form the plasma generated for the sputtering process. In addition, such direct sputtering processes are limited to providing metal oxide layers that are no more pure than the metal oxide material formed into a sputtering target.

In yet other previously known methods a reactive sputtering or a reactive evaporation process is employed where a metal oxide layer is formed by a plasma enhanced oxidation of a metal layer as it is being formed by either sputtering or evaporation, respectively. However, as was generally found for direct sputtering processes, both reactive deposition processes include gases used to form the oxidative plasma within the as being formed metal oxide layer.

Advantageously, embodiments of the present invention avoid the problems of these previously known metal oxide layer forming methods by physically vapor depositing a high purity metal layer by an evaporation process and subsequently oxidizing such completely formed metal layer to form the desired dielectric material layer. In this manner, an initially formed metal layer having high purity or ultra high purity can be provided before being oxidized. For example, metals such as Ti, Y, Zr and the like are generally available with designated purities of 99.9%, 99.99% and higher. Ultra-pure metal evaporation sources of such metals, purified by zone refining or other appropriate methods, with designated purities of at least about 99.999%, can also be used. Advantageously, methods of the present invention by employing an evaporation process to essentially completely form the metal layer before oxidation, can often provide such initially formed metal layers with designated purities exceeding that of the source material.

Referring again to FIG. 1, a thickness of dielectric material layer 40 will vary as a function of the specific high purity metal selected for the initially formed metal layer as well as the purpose for which dielectric layer 40 is intended. For example, as will be discussed below, in some embodiments of the present invention dielectric material layer 40 is employed as a gate dielectric layer of a transistor and in other embodiments such layer 40 is employed for fabricating a capacitor. As known, each of these exemplary devices have differing requirements of a dielectric layer. In addition, each of the several desirable high purity metals form a dielectric material layer when oxidized that has a characteristic dielectric constant. Also where two or more metals or a metal-silicon alloy is formed and subsequently oxidized, still other characteristic values for the dielectric constant of the oxidized layer are obtained. Thus as planned use of the final layer and its dielectric constant are factors that influence a desired thickness for layer 40, such thickness can be varied over a broad range.

Figure 2:
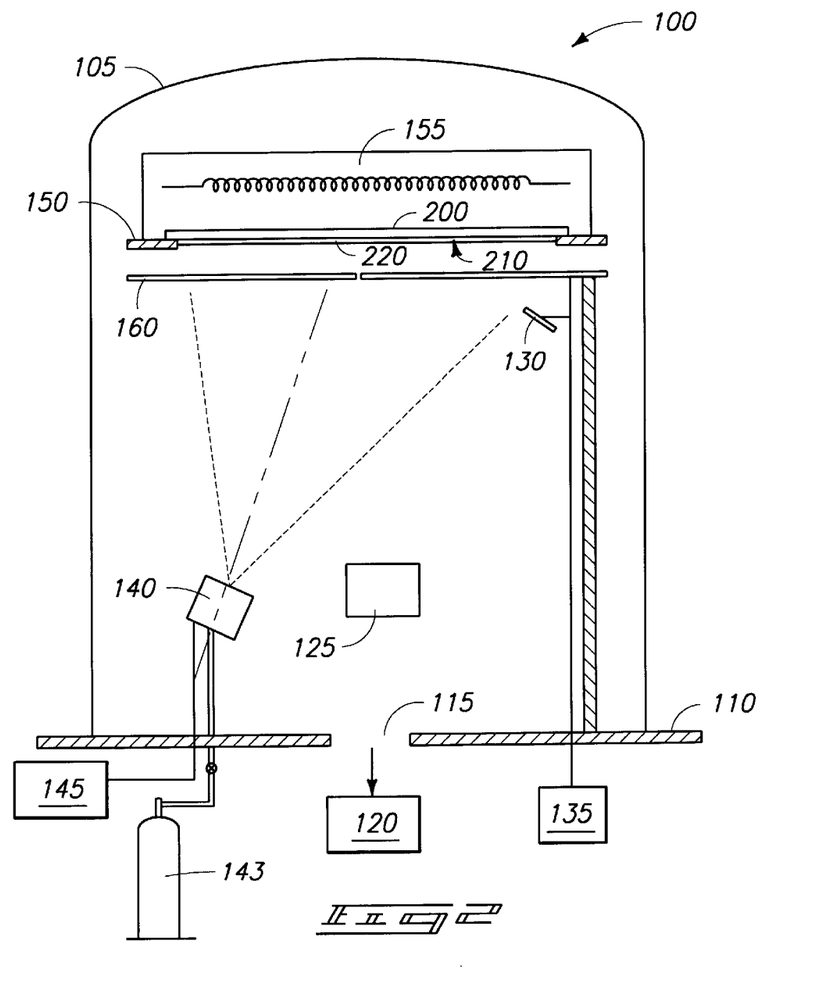
FIG. 2 is a simplified schematic representation of a vacuum chamber effective for forming a high purity metal layer in accordance with embodiments of the present invention.

As previously mentioned, dielectric material layer 40 is formed by oxidation of an initial high purity metal layer formed by an evaporation process. To aid in the understanding of evaporation processes that are in accordance with the present invention, FIG. 2 is presented to provide a simplified schematic representation of a vacuum chamber 100 and included elements that are effective for conducting such evaporation processes.

A vacuum chamber 100 is shown including a vacuum enclosure 105, a baseplate 110, a vacuum port 115 and a vacuum pump 120. In addition, an evaporation source apparatus 125, an evaporation rate and thickness sensor 130, rate and thickness control apparatus 135, ion-bombardment emitter 140, gaseous source 143 and ion-bombardment controller 145 are also included. Chamber 100 also encompasses a substrate support apparatus 150, a substrate heater 155 and a shutter apparatus 160.

In an exemplary process in accordance with the present invention, a semiconductor substrate 200 is provided within vacuum chamber 100. Specifically, substrate 200 is typically provided onto substrate support apparatus 150 such that a surface 210 is directed toward the evaporation source apparatus 125. Evaporative apparatus 125 is configured to contain a source or supply of one or more high or ultra-high purity metals that are employed for the physical vapor formation of a high purity metal layer 220 over surface 210 of substrate 200.

As is generally known, the evaporation of metals and metal alloys is conducted at pressures below atmospheric pressure and typically at pressures well below atmospheric pressure. To achieve such a low pressure, after substrate 200 is provided, vacuum enclosure 105 is sealed to baseplate 110. Vacuum pump 120, fluidically coupled to vacuum chamber 100 through vacuum port 115 is enabled to evacuate chamber 100 and thus provide a pressure below atmospheric pressure. While generally port 115 is valved to allow vacuum chamber 100 to be brought to atmospheric pressure without stopping pump 120, such valving is omitted from FIG. 2 to simplify the representation of chamber 100 and its elements herein.

Generally, evaporation processes in accordance with the present invention begin by evacuating chamber 100 to a base pressure lower that the actual process pressure to remove potential contaminants from the chamber environment. While for some embodiments of the present invention a base pressure of about $1 \times 10^{-7}$ Torr or lower is desirable, other base pressures or pump and vent cycling can also be appropriate. Once a desired base pressure is achieved, power for causing metal source material contained within apparatus 125 to evaporate is supplied. Typically such power is ramped up to a desired value to allow the metal material a time period for out-gassing. During this period of time, shutter 160 is closed to prevent physically vapor forming any metal material on surface 210. It will be noted that where apparatus 125 has more than one metal therein, different power levels can be applied to each to provide a desired evaporation rate.

Advantageously, this initial time period while shutter 160 is closed is also used to initiate and stabilize an optional ion-bombardment process and allow the heating of the metal material to provide an essentially constant evaporation rate. Thus for embodiments of the present invention where the optional ion-bombardment process is employed to provide an improved packing density of the deposited layer, gas is supplied from gaseous source 143 to ion-bombardment emitter 140. Typically gaseous source 143 provides an inert gas such as one of the noble gases, for example argon. Power necessary to provide low-energy ion-bombardment of substrate 200 once shutter 160 is opened, is then provided by ion-bombardment controller 145 which also controls such power for appropriate control of the ion-bombardment. Typically appropriate power is supplied to provide an ion beam density of between about 0.7 milliamps per square centimeter ($ma/cm^2$) and about 2 $ma/cm^2$ for the specific inert gas selected. Evaporation rate and thickness sensor 130 is positioned such that prior to opening shutter 160, the rate at which the metal source material evaporates can be determined. Evaporation control apparatus 135 is coupled to sensor 130 and evaporation apparatus 125 such that an appropriate amount of power is supplied to apparatus 125 to achieve and control the rate of evaporation at a desired value. Where more than one high or ultra-high purity metal is being evaporated, essentially simultaneously, control apparatus 135 provides control of power supplied for the evaporation of each metal. Control apparatus 135 is also coupled to shutter 160 such that when the desired evaporation rate is achieved, shutter 160 is opened and the physical vapor formation of metal layer 220 can begin. Generally, evaporation source apparatus 125 is an electron beam evaporation source or e-beam source. However, other appropriate evaporation sources 125 can also be employed for the embodiments of the present invention.

Control apparatus 135 is also configured to monitor a thickness of metal layer 220 as it is formed. Thus when a desired thickness is reached, control apparatus 135 provides a signal to close shutter 160. A desirable deposition rate can be maintained at from about 0.5 nanometers/sec (nm/sec) to about 1 nm/sec.

Some embodiments of the present invention optionally heat semiconductor substrate 200 during the physically vapor forming. Thus the initial time period while shutter 160 is closed can also be used for substrates 200 to reach a predetermined temperature, typically from about 100 degrees Celsius (° C.) to about 150° C. Heating is provided within vacuum chamber 100 by heater assembly 155. While such heater assembly is depicted in FIG. 2 as a resistance heater assembly, any other appropriate heating apparatus or heating method, appropriately positioned within chamber 100, can be employed. For example, in some embodiments heater assembly 155 is one or more heating lamps (not shown) disposed operationally proximate substrate 200.

Once an appropriate metal layer 220 is formed from the one or more metals, such layer is oxidized to form dielectric material layer 40 depicted in FIG. 1. Typically the oxidation of metal layer 220 is conducted in a high density plasma oxidation chamber.

Figure 3:
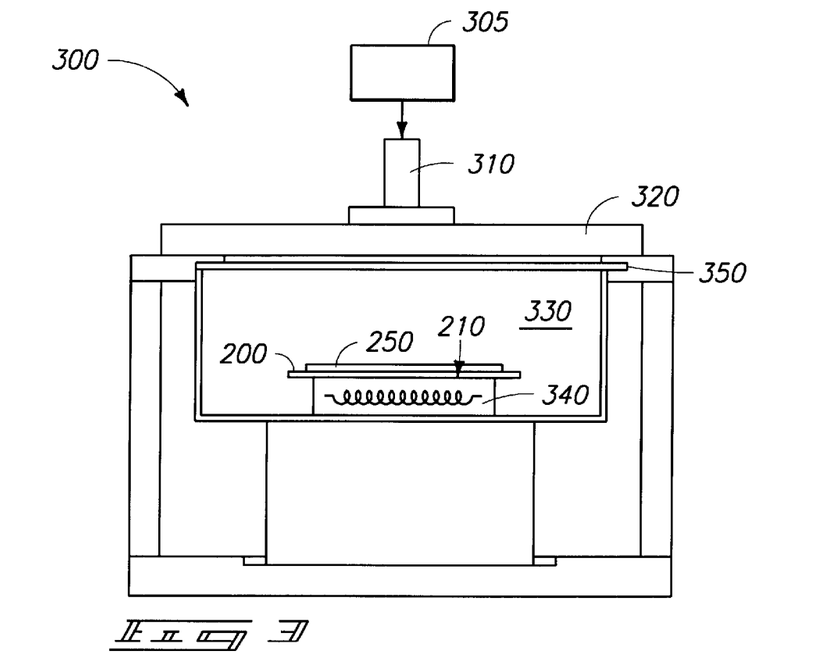
FIG. 3 is a simplified schematic representation of a plasma chamber effective for oxidizing a high purity metal layer in accordance with embodiments of the present invention.

Turning to FIG. 3, an exemplary plasma oxidation chamber 300 is depicted and includes a microwave generator 305, a co-axial wave guide 310 and a radial line slot antenna 320. In addition, chamber 300 includes a reaction chamber 330, a substrate heater and support assembly 340 and a microwave radiation plate 350. While not shown to allow chamber 300 to be more readily depicted and understand, such chamber also includes a vacuum port fluidically coupled to a vacuum pump and a reactive gas supply fluidically coupled to chamber 300 through a gas inlet.

Semiconductor substrate 200 is provided into chamber 300 and specifically onto substrate heater and support assembly 340 within reaction chamber 330. As shown, surface 210 is directed toward microwave radiation plate 350 disposed at the top of reaction chamber 330 and thus the entirety of surface 210 is exposed to the to be formed high density plasma for the oxidation of metal layer 220 (FIG. 2). Once substrate 200 is provided, oxidation chamber 300 is evacuated through the vacuum port by the vacuum pump and then back-filled with a reactive gas mixture form the gas supply through the gas inlet. Typically, the reactive gas mixture encompasses oxygen and a noble gas where a concentration of oxygen within the mixture is from about 2% by volume to about 4% by volume. Such a typical gas mixture is generally provided at an appropriate pressure, typically about 1 Torr, to provide an appropriate gas flow rate and thus provide sufficient atomic oxygen for the oxidation of metal layer 220 (FIG. 2) once a plasma is ignited. While each of the noble gases, when combined with oxygen and provided with an appropriate plasma, is effective for forming atomic oxygen for embodiments of the present invention, the selection of the specific noble gas employed can be a function of the specific metal to be oxidized and thus can vary. For instance, where the metal of metal layer 220 is Ti, a reactive mixture of oxygen and krypton is found desirable.

Typically the oxidation is conducted at a temperature between from about 350° C. and to about 450° C. which is achieved once chamber 300 is charged with the reactive gas mixture. However, it will be noted that the oxidation temperature for embodiments of the present invention will vary and can be optimized for the specific material or materials of high purity metal layer 220 as well as the specific reaction gas mixture employed. For example, a temperature of about 400° C. is typically employed where the metal selected for layer 220 is Ti, and the reactive gas mixture encompasses Kr.

The high density plasma is formed within reaction chamber 330 by providing microwaves through co-axial wave guide 310 into radial line slot antenna 320. Antenna 320 is operably coupled to microwave radiation plate 350 which serves to provide microwave energy to reaction chamber 330. Microwave generator 305 is configured to provide microwaves to reaction chamber 330 that are effective for forming atomic oxygen at a frequency of about 8.3 gigaHertz (GHz) with a power density of about 4 watts per square centimeter (W/cm$^2$). While the specific frequency employed typically is not varied, power density can be optimized for the specific metal to be oxidized and reactive gas mixture employed. Therefore, embodiments of the present invention include the range of power densities as might be used to provide optimized oxidation conditions for oxidizing metal layer 220 to form dielectric material layer 250 over surface 210 of substrate 200. It will be noted that while specific configurations of both vacuum chamber 100 (FIG. 2) and oxidation chamber 300 have been discussed, other configuration of these chambers can also be employed for embodiments of the present invention. For example, in one embodiment a unified deposition and oxidation apparatus is employed where substrate 200 is passed been modules of the unified apparatus to allow for the deposition and oxidation effective to form a dielectric material layer in accordance with the present invention. It will be noted that as embodiments of the present invention first form a high or ultra-high purity metal layer and then subsequently oxidize such layer to form a desired dielectric material layer, the dielectric layer form is also of a high purity. Thus unlike previously known methods for forming dielectric material layers, the incorporation of contaminant materials into the layers as they are formed is reduced or eliminated.

Figure 4:
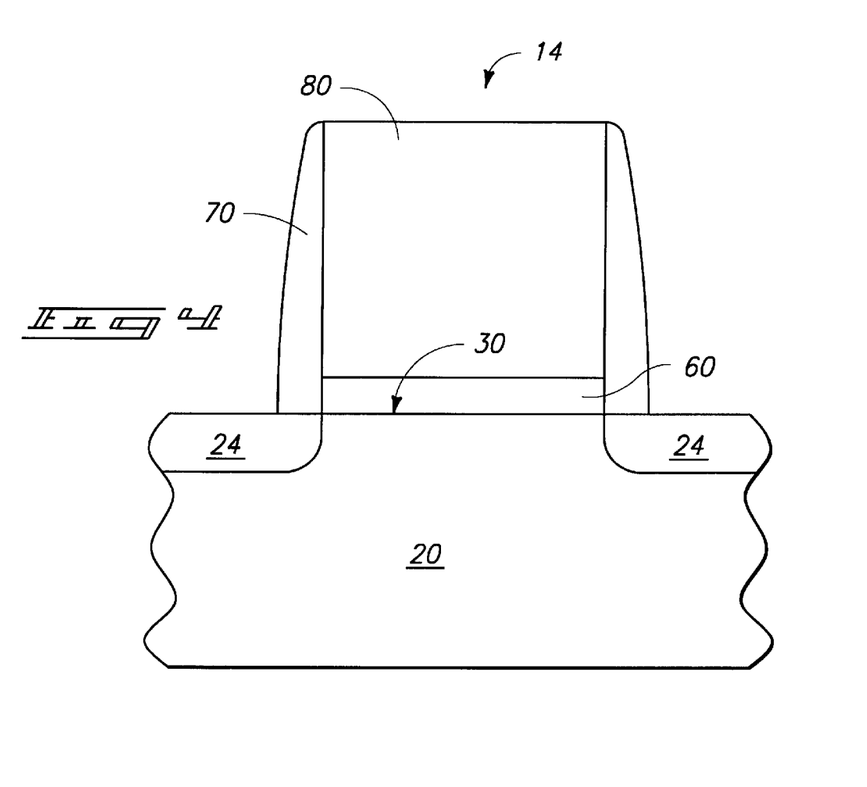
FIG. 4 is a cross-sectional view of the wafer fragment of FIG. 1 at a subsequent stage of processing, depicting a simplified representation of a transistor formed in accordance with embodiments of the present invention.

Referring to FIG. 4, a transistor 14 formed in accordance with embodiments of the present invention is shown in cross sectional view. Transistor 14 encompasses a gate dielectric layer 60 disposed over a portion of surface 30 of substrate 20. In accordance with embodiments of the present invention, gate dielectric layer 60 encompasses or consists of dielectric material layer 40 depicted in FIG. 1, and is a patterned portion thereof. Transistor 14 includes a gate electrode 80 formed over a gate dielectric layer 60. Gate electrode 80 and gate dielectric 60 can be formed in a common patterning step. Source/drain regions 24 and sidewall spacers 70 are also formed by proximate gate electrode 80, source/drain regions 24 are within substrate 20 operably adjacent gate electrode 80 and spacers 70 are laterally adjacent gate electrode 80 and gate dielectric 60.

It will be noted that transistor 14 is a simplified transistor representation, and that more complex transistor structures are also encompassed by embodiments of the present invention. For example, in some embodiments, transistor 14 is a MOSFET having an gate dielectric layer 60 that has an equivalent oxide thickness (EOT) of 2 nm or less while having an actual thickness of as much as about 6 nm or more. Such an advanced MOSFET can also have a gate length of about 0.25 micron or less and be encompassed within an integrated circuit such as a dynamic random access memory (DRAM), static random access memory (SRAM) or any of the various other memory integrated circuits. Transistor 14 can also encompass a gate dielectric layer 60 that has an EOT of greater than 2 nm and a gate length of more than 0.25 micron. As previously mentioned, it is known that each of the several desirable high purity metals, two or more metals or metal-silicon alloys, employed for forming the initial metal layer, have a characteristic dielectric constant when oxidized to form gate dielectric layer 60. Therefore, for embodiments in accordance with the present invention, a specific thickness can be selected for the initial metal layer, such that when oxidized and patterned to form gate dielectric layer 60, advantageously provides the appropriate EOT. Thus, it will be understood that the EOT of gate dielectric 60 is a function of the specific material encompassed the initial metal layer formed as a precursor for dielectric layer 60.

Transistor or integrated circuit embodiments in accordance with the present invention, therefore advantageously provide for readily forming gate dielectric layer 60 having a desired EOT. Thus, methods for forming dielectric material layers 40 (FIG. 1) with high-dielectric constants, such as $TiO_2$, $Y_2O_3$, $ZrSiO_4$ and the like over substrate 20 are provided where such materials can be readily formed by oxidation of an appropriate initial metal layer as previously described. An exemplary method of forming a transistor encompasses providing a semiconductor substrate having a surface and forming a high purity metal layer overlying the surface by electron beam evaporation. After forming the high purity metal layer, such is oxidized employing atomic oxygen generated in a high density krypton plasma environment to form a dielectric layer. A gate electrode material is then formed over the dielectric layer and both layers appropriately patterned.

Figure 5:
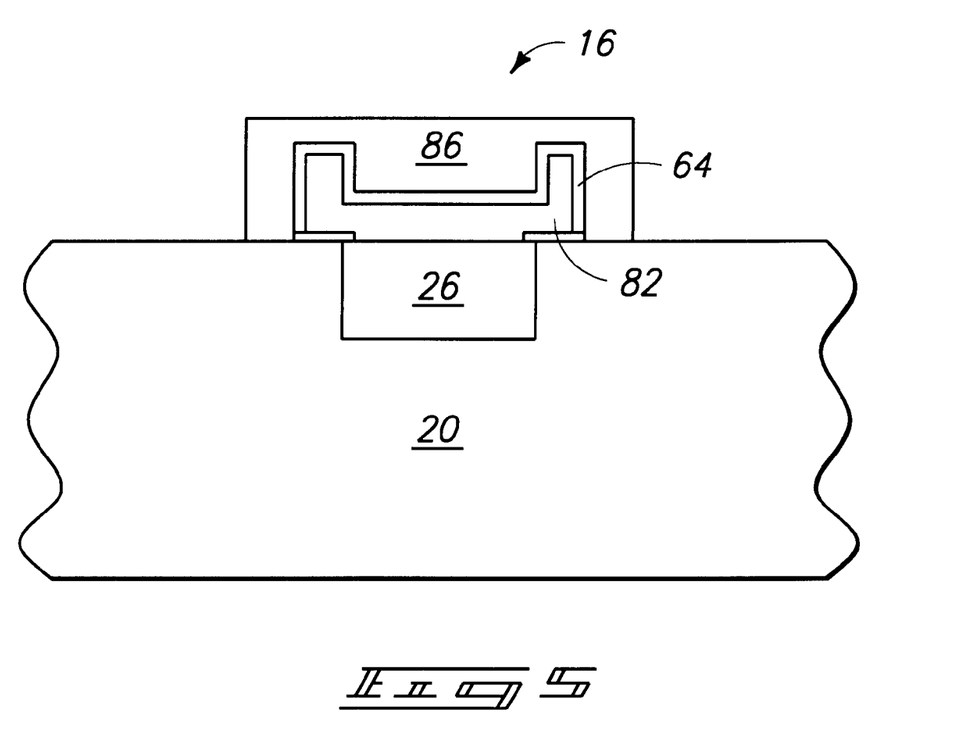
FIG. 5 is a cross-sectional view of a wafer fragment depicting a simplified representation of a capacitor structure formed in accordance with embodiments of the present invention.

Turning now to FIG. 5 a simplified capacitor structure 16, formed in accordance with embodiments of the present invention, is depicted. Capacitor structure 16 is shown overlying a doped region 26, disposed in semiconductive substrate 20. A lower capacitor electrode 82 electrically contacts region 26, a capacitor dielectric 64 overlies electrode 82 and a second capacitor electrode 86 overlies capacitor dielectric 64.

Capacitor dielectric 64 is advantageously formed in a manner analogous to that of dielectric material layer 40 of FIG. 1. Thus, after first forming and patterning lower capacitor electrode 82, an initial metal layer (not shown) is formed and subsequently oxidized to form capacitor dielectric layer 64 by any of the methods of such forming and oxidation described as being in accordance with the present invention. An exemplary method for forming capacitor 16 encompasses providing a first capacitor electrode and forming a high purity metal layer over the capacitor electrode. After forming the high purity metal layer, such layer is oxidized to form a dielectric layer by employing atomic oxygen generated in a high density krypton plasma environment. Capacitor 16 is completed by forming a second capacitor electrode over the dielectric layer.

It will be noted that any and all of the methods and materials, in accordance with the present invention, previously described for forming the initial high purity metal layer and oxidizing that layer to form a dielectric material layer are generally applicable to the forming of transistor 14 (FIG. 4) and capacitor 16 (FIG. 5). In addition, it will be noted that while such methods are advantageous for forming thin dielectric layers with high equivalent oxide thicknesses, such layers are not limited to such thin dielectric layers. Thus thicker dielectric material layers, suitable for forming capacitor dielectric layers having a thickness of 10 nm or more, can also be formed in accordance with the present invention.

In compliance with the statute, the invention has been described in language more or less specific as to structural and methodical features. In addition, advantages of the invention of the instant application have become apparent by and through the descriptions and examples provided. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a dielectric material comprising:
   providing a semiconductor substrate within a vacuum chamber;
   physically vapor forming a high purity metal layer of at least about 99.9% purity over the semiconductor substrate; and
   oxidizing the high purity metal layer to form the dielectric material employing atomic oxygen generated in a high density plasma environment.

2. The method of claim 1, wherein the physically vapor forming comprises an electron beam evaporation.

3. The method of claim 2, wherein the physically vapor forming comprises:
   prior to the electron beam evaporation, evacuating the vacuum chamber to a base pressure of about $1 \times 10^{-7}$ Torr or lower; and
   providing a low-energy ion-bombardment source directed towards the semiconductor substrate during the electron beam evaporation.

4. The method of claim 1, wherein the physically vapor forming comprises an electron beam evaporation, and further comprising providing a low-energy argon ion-bombardment directed towards the semiconductor substrate during the electron beam evaporation.

5. The method of claim 1, wherein the high purity metal layer comprises two or more high purity metals.

6. The method of claim 5, wherein at least one of the two or more high purity metals comprises a metal-silicon alloy.

7. The method of claim 1, wherein the physically vapor forming comprises forming the high purity metal having a designated purity of about 99.999% or higher.

8. The method of claim 1, wherein the physically vapor forming comprises selecting the high purity metal from the group of metals consisting of titanium, yttrium, zirconium, hafnium and/or mixtures thereof.

9. The method of claim 1, wherein the physically vapor forming comprises:
   electron beam evaporation of the high purity metal;
   prior to the electron beam evaporation, heating the semiconductor substrate to a temperature of about 100° Celsius (° C.) to about 150° C.; and
   during the evaporation, maintaining the temperature of the semiconductor substrate at a temperature of about 100° Celsius (° C.) to about 150° C.;
   and providing a low-energy ion-bombardment source directed toward the semiconductor substrate during the electron beam evaporation.

10. The method of claim 1, wherein the atomic oxygen is generated using an oxygen and noble gas mixture.

11. The method of claim 10, wherein the noble gas mixture comprises argon, krypton or xenon combined with between about 2% to about 4% oxygen by volume.

12. The method of claim 1, wherein the atomic oxygen is generated from a mixture of krypton and oxygen comprising about 3% by volume oxygen exposed to microwave energy with a power density of about 4 Watts per square centimeter and a frequency of about 8.3 gigahertz to form a high density plasma characterized by an electron temperature of less than about 1.3 electron volts.

13. A method for forming a dielectric material layer over a semiconductor substrate comprising:
   providing the semiconductor substrate in a vacuum chamber, the vacuum chamber having an evaporation apparatus therein;

after the providing, evacuating the vacuum chamber to a base pressure of about $1 \times 10^{-7}$ Torr or lower;

heating the semiconductor substrate to a temperature of about 100° C. to about 150° C.;

providing a high purity metal to the evaporation apparatus;

providing sufficient energy to the evaporation apparatus for forming a layer of the high purity metal over the semiconductor substrate;

during the forming, maintaining the semiconductor substrate to a temperature of about 100° C. to about 150° C. and providing a source of argon ion-bombardment having an ion-beam density of about 0.7 milliamps per square centimeter ($ma/cm^2$) to about 2 $ma/cm^2$, the ion-beam directed towards the semiconductor substrate;

after the forming, oxidizing the high purity metal layer to form a dielectric material layer, the oxidizing comprising providing a source of atomic oxygen in a high density plasma.

14. The method of claim 13, wherein the providing the high purity metal comprises providing a metal selected from the group consisting of titanium, yttrium, zirconium, hafnium and/or mixtures thereof.

15. The method of claim 13, wherein the providing the high purity metal comprises providing two or more metals, at least one metal comprising a metal-silicon alloy.

16. The method of claim 13, wherein the physically vapor forming comprises forming the high purity metal having a designated purity of about 99.999% or higher.

17. The method of claim 13, the oxidizing further comprising providing a noble gas mixture comprises argon, krypton or xenon combined with between about 2% to about 4% oxygen by volume for forming the high density plasma.

18. The method of claim 13, wherein the atomic oxygen is generated from a mixture of krypton and oxygen comprising about 3% by volume oxygen exposed to microwave energy with a power density of about 4 Watts per square centimeter and a frequency of about 8.3 gigahertz to form a high density plasma characterized by an electron temperature of less than about 1.3 electron volts.

19. The method of claim 13, wherein the evaporation apparatus comprises an electron beam evaporation apparatus.

20. The method of claim 13, wherein providing sufficient energy comprises providing energy sufficient to evaporate the high purity metal at an evaporation rate of between about 0.5 nanometers per second (nm/sec) to about 1.5 nm/sec.

21. A method for forming a transistor, comprising:

providing a semiconductor substrate having a surface;

forming a high purity metal layer of at least about 99.9% purity overlying the surface by electron beam evaporation;

after forming the high purity metal layer, oxidizing the high purity metal layer to form a dielectric layer employing atomic oxygen generated in a high density krypton plasma environment; and forming a gate electrode over the dielectric layer.

22. The method of claim 21, wherein the high purity metal layer comprises two or more high purity metals.

23. The method of claim 22, wherein at least one of the two or more high purity metals comprises a metal-silicon alloy.

24. The method of claim 21, wherein the forming of the high purity metal layer comprises forming the high purity metal having a designated purity of about 99.999% or higher.

25. The method of claim 21, wherein the forming of the high purity metal layer comprises selecting the high purity metal from the group of metals consisting of titanium, yttrium, zirconium, hafnium and/or mixtures thereof.

26. The method of claim 21, wherein the forming of the high purity metal layer further comprises providing a low-energy argon ion-bombardment directed towards the semiconductor substrate during the electron beam evaporation.

27. A method of forming a capacitor structure, comprising:

providing a first capacitor electrode;

forming a high purity metal layer of at least about 99.9% purity over the first capacitor electrode;

after forming the high purity metal layer, oxidizing the high purity metal layer to form a dielectric layer employing atomic oxygen generated in a high density krypton plasma environment; and forming a second capacitor electrode over the dielectric layer.

28. The method of claim 27, wherein the high purity metal layer comprises two or more high purity metals.

29. The method of claim 28, wherein at least one of the two or more high purity metals comprises a metal-silicon alloy.

30. The method of claim 27, wherein the forming of the high purity metal layer comprises forming the high purity metal having a designated purity of about 99.999% or higher.

31. The method of claim 27, wherein the forming of the high purity metal layer comprises selecting the high purity metal from the group of metals consisting of titanium, yttrium, zirconium, hafnium and/or mixtures thereof.

32. The method of claim 27, wherein the forming of the high purity metal layer further comprises providing a low-energy argon ion-bombardment directed towards the semiconductor substrate during an electron beam evaporation.

33. The method of claim 1, further comprising providing a metal source material for the physically vapor forming of the high purity metal layer, and wherein the high purity of the metal layer exceeds a purity of the metal source material.

34. The method of claim 13, wherein the heating comprises maintaining the temperature during the forming of the layer of the high purity metal.

35. The method of claim 21, further comprising providing a metal source material for the forming of the high purity metal layer, and wherein the high purity of the metal layer exceeds a purity of the metal source material.

36. The method of claim 27, further comprising providing a metal source material for the forming of the high purity metal layer, and wherein the high purity of the metal layer exceeds a purity of the metal source material.

* * * * *

UNITED STATES PATENT AND TRADEMARK OFFICE
CERTIFICATE OF CORRECTION

PATENT NO. : 6,534,420 B2  Page 1 of 1
DATED : March 18, 2003
INVENTOR(S) : Kie Y. Ahn et al.

It is certified that error appears in the above-identified patent and that said Letters Patent is hereby corrected as shown below:

Column 2,
Lines 27 and 28, please replace "Thus it would desirable provide methods" with
-- Thus it would be desirable to provide methods --

Column 7,
Line 24, please replace "to be more readily depicted and understand" with -- to be more readily depicted and understood --

Column 8,
Line 49, please replace "MOSFET having an gate dielectric layer" with -- MOSFET having a gate dielectric layer --

Signed and Sealed this

Twelfth Day of August, 2003

JAMES E. ROGAN
*Director of the United States Patent and Trademark Office*